United States Patent [19]

Allen et al.

[11] Patent Number: 5,699,282

[45] Date of Patent: Dec. 16, 1997

[54] METHODS AND TEST STRUCTURES FOR MEASURING OVERLAY IN MULTILAYER DEVICES

[75] Inventors: Richard A. Allen; Michael W. Cresswell, both of Gaithersburg, Md.

[73] Assignee: The United States of America as represented by the Secretary of Commerce, Washington, D.C.

[21] Appl. No.: 679,428

[22] Filed: Jul. 8, 1996

Related U.S. Application Data

[63] Continuation-in-part of Ser. No. 382,973, Feb. 3, 1995, Pat. No. 5,617,340, which is a continuation-in-part of Ser. No. 236,202, Apr. 28, 1994, Pat. No. 5,602,492.

[51] Int. Cl.$^6$ .................... G01B 11/27; G01D 18/00
[52] U.S. Cl. .................... 364/571.01; 364/559; 324/699; 324/715; 324/716; 324/765; 437/8; 430/22; 430/30
[58] Field of Search ............... 364/559, 571.01, 364/579; 324/601, 602, 691, 699, 715, 716, 719, 765; 250/491.1; 257/48; 228/103, 105; 156/626.1, 627.1; 29/593; 33/545, 547; 382/151; 437/8; 348/87, 94, 95; 356/372, 373, 394, 400, 401; 430/22, 30

[56] References Cited

U.S. PATENT DOCUMENTS

| | | | |
|---|---|---|---|
| 4,386,459 | 6/1983 | Boulin | 29/574 |
| 4,510,446 | 4/1985 | Braun et al. | 324/158 R |
| 4,516,071 | 5/1985 | Buehler | 324/158 R |
| 4,538,105 | 8/1985 | Ausschnitt | 324/158 R |
| 4,571,538 | 2/1986 | Chow | 324/65 R |
| 4,672,314 | 6/1987 | Kokkas | 324/158 R |
| 4,810,335 | 3/1989 | Hieber | 204/192.33 |
| 4,815,854 | 3/1989 | Tanaka et al. | 356/356 |
| 4,871,962 | 10/1989 | Cheung | 324/65 R |
| 4,918,377 | 4/1990 | Buehler et al. | 324/691 |
| 4,938,600 | 7/1990 | Into | 356/401 |
| 4,983,908 | 1/1991 | Tada et al. | 324/158 P |
| 5,015,323 | 5/1991 | Gallagher | 156/345 |
| 5,044,750 | 9/1991 | Shamble | 356/372 |
| 5,051,690 | 9/1991 | Maly et al. | 324/158 R |
| 5,082,792 | 1/1992 | Pasch et al. | 437/7 |
| 5,280,437 | 1/1994 | Corliss | 364/559 |
| 5,385,289 | 1/1995 | Bloch et al. | 228/103 |
| 5,438,413 | 8/1995 | Mazor et al. | 356/363 |
| 5,498,500 | 3/1996 | Bae | 430/22 |

*Primary Examiner*—Emanuel T. Voeltz
*Assistant Examiner*—Tony M. Cole
*Attorney, Agent, or Firm*—Larson and Taylor

[57] ABSTRACT

Imaging instruments for inspecting products, such as semiconductor chips, are calibrated by providing a reference test structure having features which can be located by electrical measurements not subject to tool-induced shift and wafer-induced shift experienced by the imaging instrument, and by the imaging instrument. The reference test structure is first qualified using electrical measurements, and is then used to calibrate the imaging instrument. The electrical measurements are made by forcing a current between a plurality of spaced reference features and a pair of underlying conductors. Conductive connectors formed in vias in an insulating layer overlying the pair of conductors and individually connected to a respective conductive element formed on the insulating layer are each spaced at progressively greater distances relative to the centerline of the space between the pair of conductors, such that a null-overlay element may be identified.

20 Claims, 5 Drawing Sheets

METHODS AND TEST STRUCTURES FOR MEASURING OVERLAY IN MULTILAYER DEVICES

CROSS-REFERENCE TO RELATED APPLICATIONS

This application is a continuation-in-part of U.S. patent application Ser. No. 08/382,973 now U.S. Pat. No. 5,617,340, filed Feb. 3, 1995, which is, in turn, a continuation-in-part of U.S. patent application Ser. No. 08/236,202, filed Apr. 28, 1994 now U.S. Pat. No. 5,602,492.

FIELD OF THE INVENTION

The present invention is directed to submicrometer feature placement metrology, for verifying patterns used in fabrication of semiconductor integrated circuits and the like. More particularly, the invention relates to novel reference standard and methods for measuring "overlay" as experienced in semiconductor manufacture, and for calibrating imaging equipment used in fabrication of semiconductors (including both optical microscopes and electron microscopes) so as to avoid certain classes of errors inherent to known overlay imaging metrologies.

BACKGROUND OF THE INVENTION

As is well known, semiconductor manufacturing processes, as used to manufacture integrated circuits (ICs), involve a succession of fabrication operations requiring accurate registration of the tools used in each operation with respect to the semiconductor wafer being processed. More specifically, successful semiconductor manufacturing requires highly accurate alignment of features on masks used in photolithographic processes, and of their projection onto the wafer, such that successive mask-defined patterns of material are located on the wafer with accuracy in the low tens of nanometers range.

An important class of applications of the invention involves the mapping of the local "overlay." This term, in the present context, concerns the relative location of features formed in different steps in an IC wafer fabrication process. In particular, the "overlay" is a vector quantity defined at every location on the substrate as the difference between the vector position $P_1$ of (for example) a first-formed portion of a conductive structure on a substrate with respect to an arbitrary reference point, and the vector position of the corresponding point $P_2$ in a second-formed portion of the structure. In the common circumstance where the first and second portions are to be directly aligned, the overlay is zero where $P_1=P_2$, i.e., when the composite pattern is formed correctly.

It will be appreciated that overlay may thus occur in orthogonal x and y dimensions. For example, suppose an underlying conductive "trace" extending in the x direction is to be connected to an overlying trace extending in the y direction by a connecting "post" filling a through-hole or "via" formed in an intervening insulative layer. If the via is displaced in the y direction from its proper location, the connecting post will be off-center with respect to the underlying conductor, and may fail entirely to make adequate contact thereto. However, this overlay in the y-dimension may not affect the contact between the post and the orthogonal upper conductive trace. Accordingly, reference herein to overlay measured with respect to differing layers of a multiple-layer structure should be understood to include overlay of connecting elements formed in vias with respect to associated conductors.

Considering this concept further, patterning errors result when the features formed on a substrate in a second image-transfer operation are not properly located relative to features having been formed thereon in a prior operation, or when a feature is improperly located with respect to other features formed in the same imaging operation. In other words, patterning errors may derive from the misalignment of images formed sequentially by the image-transfer tooling, e.g., when two or more masks are used in sequential photolithography operations to form a resulting composite pattern on the substrate, and may also result from errors or defects in one or more of the masks, e.g., improper placement of features on the masks.

The parent applications, Ser. Nos. 08/382,973 and 08/236,202, and Ser. No. 07/852,439, the application from which the latter application claims priority and which is now U.S. Pat. No. 5,383,136, disclose methods and test structures useful in measuring overlay, all involving measurement of voltage drops between sections of a composite structure responsive to a current being forced therethrough. More specifically, in the grandparent application Ser. No. 07/852,439, now U.S. Pat. No. 5,383,136, a quantity "x," referred to as the "offset," is defined to be the displacement of the center tap of a potentiometer formed on a substrate in a second image-transfer operation from the midpoint between the two end taps of the potentiometer formed thereon in a prior image-transfer operation. When the offset x is zero, the composite pattern is defined to have zero-overlay. Thus, the offset x measured using the potentiometer in many cases corresponds to the overlay of the overlaying patterns forming the composite pattern, that is, when the overlay is due entirely to the offset x. While for such potentiometers the offset x of an individual potentiometer may or may not be defined to be the same as the overlay of the composite pattern, the difference between the values of x and for individual composite patterns will be the same in foreseeable applications.

It is common practice in the prior art to use imaging instruments to monitor various aspects of semiconductor manufacturing operations, including overlay. It is to be understood that optical and electron microscopes, for example, are included in the term "imaging instruments", as used herein.) The accuracy of these imaging instrument measurements may be compromised by so-called "tool-induced shift" and/or "wafer-induced shift".

Generally speaking, tool-induced shift ("TIS") arises from physical properties of the imaging instrument and contributes a constant amount to the measurement of overlay (that is, misalignment of two or more separately formed features) independently of the properties of the target features. Wafer-induced shift ("WIS") arises from asymmetries in the formation of the target features that are inspected with the imaging instrument. For example, a conductive "feature" which is to be located using an imaging instrument may in theory have vertical sides meeting a flat upper surface at square corners. However, the process used to form the conductor may be such that the sides of the conductor are not parallel to one another, and thus may not meet the top of the conductor at right angles. Using an imaging instrument to measure the width of the feature, or the spacing of adjacent features formed in successive imaging operations, will result in unpredictable errors; as the severity of these errors varies with the process used to form the structure being measured, such errors are referred to as wafer-induced shift. As noted, WIS is process-dependent and varies somewhat unpredictably from one type of manufacturing process to another, although a given manufacturing process typically exhibits fairly consistent WIS.

Typically, the effects of TIS on measurements of a particular structure on a substrate can be minimized by 180 degree rotation of the substrate about the optical axis of the instrument and averaging the measurements made with respect to the structure. While this process is generally workable, it requires substantial additional effort and time. WIS, however, cannot be conveniently estimated, can amount to 50 nanometers or more, can affect the impact of TIS on any given measurement, and is highly process-dependent.

Therefore, it can be seen that there is a distinct need for a method for evaluating the TIS of an imaging instrument, and for separately evaluating the WIS as measured by an imaging instrument of structures formed using a particular processing sequence.

Electrical measurements, such as the voltage-drop measurements described in the predecessor applications, do not suffer from TIS; to the extent electrical measurements suffer from an electrical analog of WIS, the effect of this analog is much smaller than that exhibited by optical measurements, and in many cases can be substantially minimized, as described in the predecessor applications. Accordingly, it would be desirable to provide a test structure having features detectable by imaging instruments, and certified by electrical measurements, which could then be supplied to manufacturers or inspectors of products for calibration of imaging instruments. That is, it would be desirable to provide a structure manufactured, and tested electrically, to certify the relation of a plurality of features, which are visible using an imaging instrument, to be calibrated, the resultant calibration information being then provided to the user of the imaging instrument. The imaging instrument could then be calibrated accordingly. It would be further desirable to provide an electrically-testable structure which entirely eliminated any electrical analog of WIS.

OBJECTS OF THE INVENTION

It is therefore an object of the invention to provide an improved test structure and method for calibrating imaging instruments used for measuring the location of features on a substrate, and, in particular, used for overlay measurement, such that tool-induced shift and wafer-induced shift in such measurements can be correctly compensated for.

It is a further object of the invention to provide a method for correlating electrical measurements of the relative location of features on a substrate with measurements thereof made using imaging instruments, in order to calibrate such instruments.

It is also an object of the invention to provide a method and a test structure whereby a test structure can be certified electrically and used subsequently to calibrate imaging instrumentation, including both optical microscopes and electron microscopes and the like.

It is a further object of the invention to provide a test structure and method for determining when such a structure, or one of a series of test elements comprised thereby, is formed with zero (or minimal) overlay.

SUMMARY OF THE INVENTION

As noted, measurements made with imaging instruments, again including both optical microscopes and electron microscopes, suffer from a number of deficiencies which are addressed by the present invention. For example, if an optical microscope is not aligned precisely with the object being inspected, a systematic tool-induced error or shift ("TIS") will be introduced into all measurements made thereby. Furthermore, suppose the spacing of two conductive lines is to be measured. Such conductors ideally form rectangles in cross-section but in practice may be generally irregularly trapezoidal, i.e., the side walls of the conductors may not be perpendicular to the substrate, or may be substantially asymmetrical. Furthermore, conductors formed in differing operations may exhibit differing asymmetries. Measurements made using imaging instruments to locate such conductors exhibit substantially unpredictable errors, referred to as wafer-induced shift ("WIS"). WIS contributes error to measurements of the relative locations of conductors made using imaging instruments.

Electrical measurements, by comparison, are not susceptible to TIS, and, in general, can be designed to substantially minimize WIS. In accordance with the invention, a test structure is provided which has features the locations of which are "readable" by imaging instruments, and certifiable by electrical measurement, which can then be supplied to manufacturers, users, or inspectors of products for calibration of imaging instruments. Such a structure can be manufactured and tested electrically to certify the relation of a plurality of optically-readable features, and this information then provided to the individual or organization using the imaging instrument, for calibration of the imaging instrument.

According to the present invention, a hybrid structure, "hybrid" in the sense that the structure defines features that can be detected using both imaging and electrical instruments, is provided. In one embodiment, first and second patterned layers of material are formed in succession on a substrate, each defining reference indicia that can be read optically; the remainder of the structure formed by each of the two layers bears a specified spatial relationship to the respective reference indicia, and forms features that can be examined electrically to identify a null-overlay structure. Such null-overlay electrical measurements provide an objective indication of the actual alignment of the two layers, while measurements of the relationship of the reference indicia made using the imaging instrument include TIS and WIS. A comparison of these two sets of observations can be used to calibrate the optical instrument for subsequent measurements. The null-overlay structure can also be combined with the test structures shown in the predecessor applications, for calibration thereof.

In an example of provision of a test structure for calibrating an imaging instrument, a first conductive pattern is deposited on a substrate. The first pattern includes reference members for detection by an imaging instrument in a known spatial relationship to the reference members. A second patterned insulative layer is placed on the first layer which contains features or openings to allow electrical contact to the first patterned layer. A final layer is a conductive layer which allows electrical signals to be brought to the openings in the insulative layer. The connecting features are spaced progressively further from a baseline aligned with the reference marks, such that each feature exhibits different overlay. The feature exhibiting minimum overlay with respect to the corresponding test point, ideally zero overlay, is identified electrically. A measurement of the location of the reference marks with respect to the reference members if made using the imaging instrument to be calibrated. The imaging instrument is calibrated using the electrical identification of the minimum overlay feature, eliminating TIS and WIS from subsequent comparable measurements of overlay made using the imaging instrument.

More specifically, a substrate is provided at each of a number of sites with multiple instances of a composite pattern suitable for separate evaluation of overlay by imaging instruments and by electrical measurement. In a specific example, a first component of each composite pattern comprises reference members which enable an imaging instrument to determine their placement relative to the instrument's coordinate reference frame, e.g., a pair of extended parallel lines of a first conductive layer, having width and spacing consistent with those of frame-in-frame targets commonly used for optical overlay metrology in semiconductor-wafer processing. Copies of the first component of the composite pattern are formed at multiple locations on the substrate using a stepper device to move a tool, e.g., a photolithographic mask, between the locations. A number of copies of a second component of the composite pattern, each defining reference marks, are also deposited on the substrate at each location of the first component, such that each instance of the first component and a complementary instance of the second component are located in a common region of the substrate. The result is that an instance of a composite multiple-layer pattern is replicated at each common region, wherein each instance of the composite pattern is defined by the superposition of a first component and a second component. The second component may be imaged from a second mask and replicated on the substrate by the same stepper device, operating with the same exposure-site step-and-repeat parameters.

Each instance of the composite pattern has a unique overlay value represented by the position of its reference members relative to its reference marks. Thus, the reference marks and reference members of each composite pattern together constitute a "target" from which an imaging instrument can estimate the overlay with which the composite pattern at each common region was fabricated.

In order to provide a comparable electrical indication of the overlay, each of the composite patterns at every site on the substrate includes a number of designed-in zero-overlay detection features, each comprising a series of test structure elements each having varying designed-in overlay contributions in addition to the overlay with which each structure is actually fabricated, that is, in addition, to any overall site overlay of the pattern at each location. The designed-in zero-overlay detection features may be provided by varying the relative position of components of the test structure elements from an arbitrary reference point. For example, conductive members connecting upper and lower conductors of each element may be linearly progressively displaced relative to a baseline. Thus, the overlay values characterizing the set of element at each site constitute a linear series. Each element's actual overlay is the sum of the site overlay, that is, the overlay with which the entire composite pattern was replicated at that site, and the designed-in overlay for that particular element. Site overlay is in practice a random variable, but is the same for all structures at a particular site. According to the invention, the designed-in overlay contributions to the actual overlay vary in a known fashion from element to element, so that plural electrical measurements can be compared to identify a zero-overlay feature and thus to evaluate the site overlay.

As noted, the composite structures include plural test structure elements having geometries enabling zero-overlay detection; for example, zero-overlay detection features of each element may be placed linearly progressively further from a baseline. If the baseline is fixed with respect to reference marks that can be imaged using an imaging instrument, that instrument can thus be calibrated. Electrical, electromagnetic, or electrostatic testing can be performed with respect to each element to determine which, if any, of the elements at a given site is characterized by zero actual overlay, or to determine which exhibits minimal overlay. (For the purposes of conceptual definition, a structure exhibits zero actual overlay when a measurement using a hypothetical ultraprecise imaging instrument records zero overlay on examining the targets formed by the reference members and the reference marks and the measurement is free of both TIS and WIS error.) Where none of the composite test structure elements at an exposure site happens to be fabricated with zero actual overlay, as a consequence of the random site overlay contribution, the linearly progressive placements of the zero-overlay detection features enable the estimation of a zero-overlay detector index, characterizing the composite structures at each substrate site. The values of the zero-overlay detection indices in conjunction with the linear progression of the designed-in overlay, and accordingly, the set of overlays measured by the imaging instrument at a particular site, enables determination of the sum of WIS and TIS for the measurements at that respective site.

In the preferred embodiments of the present invention, the first and second layers are conductive, such that features of the second component of the pattern are to be in electrical contact with test points defined by the first component, and the overlay is measured by evaluating the resistance therebetween. Electrical identification of a "zero-overlay" feature best aligned with the underlying structure can be accomplished by forcing a current between each of the test points and the underlying conductive structure, and measuring the resistance of each of the connections.

According to another aspect of the invention, "tool-wide" errors, such as errors resulting from misalignment of photolithographic "masks" used in successive patterning operations, and "local" errors, such as misplacement of a feature within a mask, which together contribute to the overlay measured, can be distinguished from one another. A number of test structures of essentially identical configuration are formed on a single substrate, in a process wherein different portions of test structure are applied at different manufacturing steps. Analysis of overlay measured with respect to each of the test structures can be carried out to differentiate, for example, the contributions of mask alignment errors and mask patterning errors to the total overlay, while random variations in, e.g., conductor segment length measurements due to contamination or the like are effectively removed from the results.

Parent application Ser. No. 08/382,973 now U.S. Pat. No. 5,617, 340, referred to above, discloses methods and test standards of the type and characteristics just described. In one preferred embodiment discussed in more detail below, a method of implementing electrical null detection for via-to-conductor overlay is based on measuring contact continuity between layers provided through conductive connectors or "posts" formed in the vias, i.e., based on measurements of whether there is short circuit (contact) or an open circuit (non-contact). A disadvantage of the specific implementation disclosed in that application is that in order to provide a comfortable overlay-sensitivity margin, the pad-count could become quite large.

According to another aspect of the invention, several different designs for test structure elements are provided. The test structure elements are reproduced with linearly varying designed-in overlay to form test structures useful in evaluating overlay. An electrical characteristic of each element is evaluated in order to identify a particular composite element having zero or minimal overlay. Furthermore, particular ones of these elements can be combined with the test structures described in the applications referred to above.

The present invention provides the features and advantages discussed above while substantially improving the resolution of the general approach or technique of parent application Ser. No. 08/382,973, and potentially reducing the size of the "footprint" required to implement the test structure.

In accordance with a first aspect of the invention, a method is provided for calibrating an imaging instrument relative to distance measurements between features of a test structure formed on a substrate, the method comprising the steps of forming a first conductive pattern overlying the substrate and comprising first and second spaced elongate conductors; forming a second conductive pattern on a surface of an insulating layer overlying the first conductive pattern, the second conductive pattern comprising a plurality of longitudinally spaced conductive elements overlying said elongate conductors; forming a like plurality of conductive connectors in vias extending through the insulating layer, the connectors each being connected to a respective conductive element and being disposed at successively varying distances relative to said elongate conductors, at least a first one of the connectors interconnecting said first elongate conductor and one of said conductive elements, and at least a further one of the connectors interconnecting said second elongate conductor and a further conductive element; performing a series of electrical measurements between said conductive elements and said first and second elongate conductors so as to provide measured values corresponding to the degree of conduction provided by said connectors between each of the conductive elements and said first conductor and between each of said conductive elements and said second conductor; and calibrating the imaging instrument using the measured values so obtained.

In one preferred embodiment, the second elongate conductor is disposed in parallel with the first elongate conductor. Preferably, the conductive elements are formed in spaced, parallel relation and extend substantially orthogonally to the first and second conductors.

In a further preferred embodiment, particularly useful with a vector scan electron beam imaging instrument, the second elongate conductor is formed in non-parallel relation to the first elongate conductor.

Preferably, the method further comprises forming a conductive member extending through a further via to the surface of the insulating layer so that one end of said conductive member, i.e., that at the surface, defines an elongate reference. The reference can be used as one target component in a "bars-in-bars" configuration such as described above. Advantageously, the second elongate conductor and the elongate reference defined by the conductive member are disposed in axial alignment and the second elongate conductor and the elongate reference are disposed in parallel with the first elongate conductor.

Performing the electrical measurements preferably includes determining whether a short circuit exists between each of the conductive elements and the conductors and whether an open circuit exists between each of the conductive elements and the conductors. Advantageously, performing said electrical measurements additionally comprises determining whether a high resistance connection exists between each of the conductive elements and the conductors.

In one embodiment, the imaging instrument comprises an optical microscope and, in another, the imaging instrument comprises an electron microscope.

In a preferred implementation, the first and second conductors are separated by a space therebetween and the electrical measurements are used to determine which of said conductive connectors most closely have zero overlay relative to the centerline of the space between said conductors. In one embodiment, the connectors have a width less than that of the space between the conductors, although this width can also be greater than that of the space.

According to a further aspect of the invention, a test structure is provided for enabling calibration of imaging instruments for measuring overlay, the test structure comprising a substrate, a first conductive pattern disposed on a surface of said substrate, a second conductive pattern disposed on a surface of an insulating layer overlying the substrate, the first conductive pattern including a first and second elongate conductors and the second conductive pattern comprising a plurality of longitudinally spaced conductive elements overlying said elongate conductors along the lengths thereof, and a like plurality of conductive connectors each extending through a via in said insulating layer and being connected to a respective conductive element, said connectors being disposed at successively varying distances relative to said elongate conductors, at least a first one of the connectors interconnecting the first elongate conductor and one of the conductive elements, and at least a further one of the connectors interconnecting the second conductor and a further conductive element.

In one embodiment, the second elongate conductor of the test structure is disposed parallel to said first elongate conductor, while in another, the second elongate conductor is disposed in non-parallel relation to the first elongate conductor.

Preferably, the test structure comprises a conductive member or post extending through a further via to the surface of the insulating layer so that the end thereof at the surface defines an elongate reference used as part of the an optical target configuration as explained above. Advantageously, the second elongate conductor and the elongate reference defined by the conductive post are disposed in axial alignment, and the second elongate conductor and the elongate reference are disposed in parallel with the first elongate conductor. The conductive elements preferably comprise a row of spaced parallel bars extending substantially orthogonally to and overlying the first and second conductors.

Other features and advantages of the present invention are set forth in and will be apparent from the detailed description of preferred embodiments of the invention which follows.

BRIEF DESCRIPTION OF THE DRAWINGS

The invention will become more readily understood by making reference to the accompanying drawings, in which.

DESCRIPTION OF THE PREFERRED EMBODIMENTS

Figure 1:
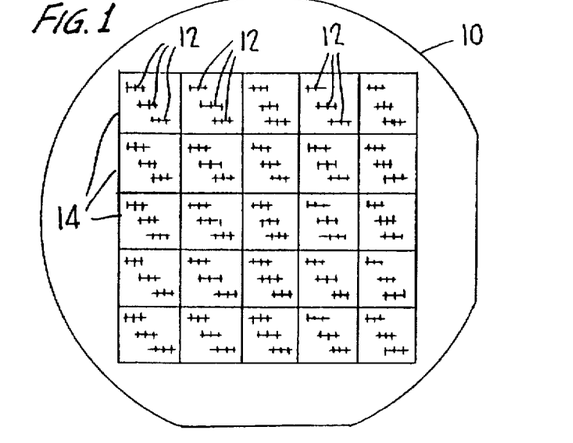
FIG. 1 illustrates a typical semiconductor wafer having a number of test structures according to the invention formed at plural exposure sites thereon.

FIG. 1 shows an exemplary layout for an integrated circuit wafer 10 employing composite test structures 12 at each of twenty-five "exposure sites" 14. In this example, twenty-five nominally identical integrated circuit "chips" are to be formed on wafer 10, one at each exposure site 14; three identical composite test structures 12 are formed simultaneously, at each of the twenty-five exposure sites 14, in order to obtain further advantages provided by the method and test structure of the invention. Such composite test structures 12 may be as shown in FIGS. 5 and 6 or FIGS. 9–11 and discussed in detail below. Alternatively, structures 12 may be composed of patterns generally as shown schematically in FIGS. 2(a)–(c), which may incorporate test structure elements as shown in one of FIGS. 7 and 8 in test structures shown in FIGS. 5, 6 and 9–11.

Figure 5:
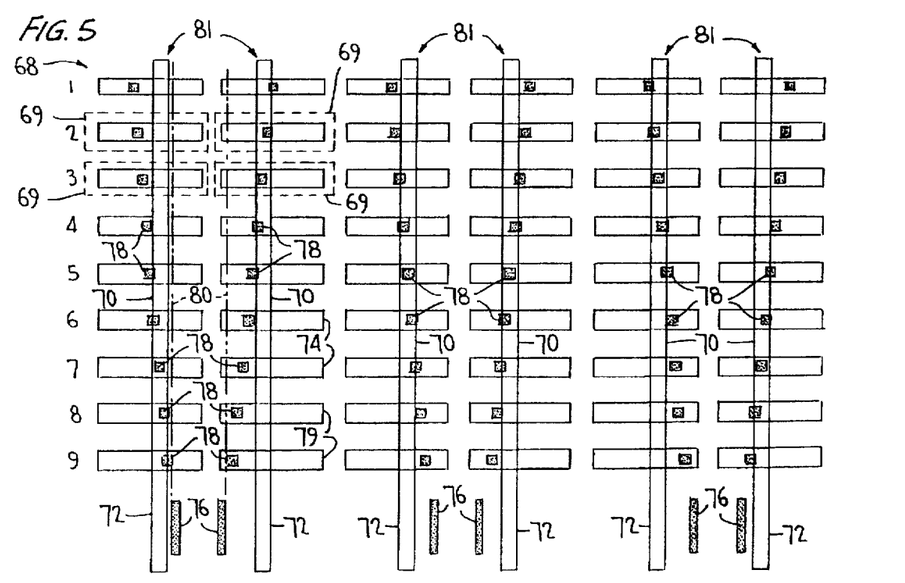
FIG. 5 shows a composite test structure exhibiting zero overlay.
Figure 6:
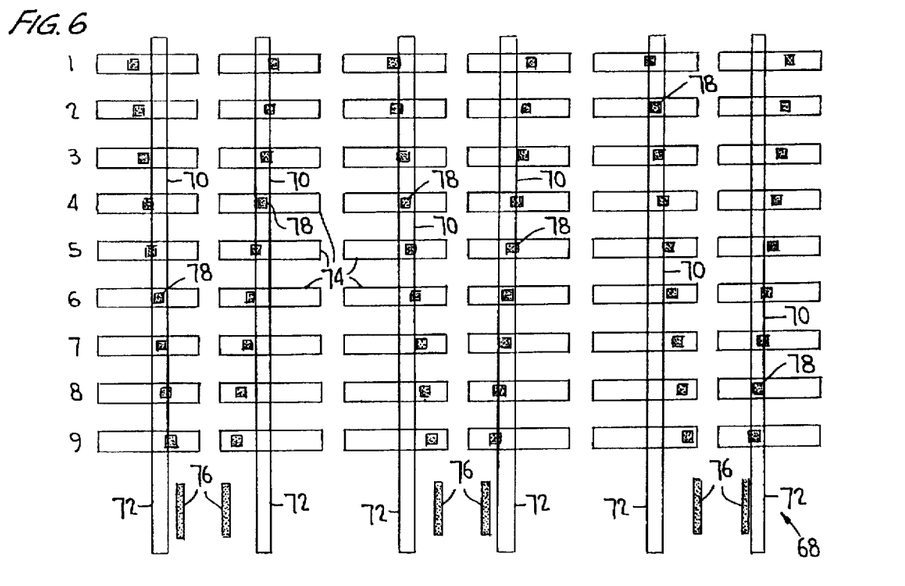
FIG. 6 shows a composite test structure comparable to that of FIG. 5 but with non-zero overlay.

The present discussion of FIGS. 1 and 2(a)–(c) is essentially that of the parent applications, and is repeated here to provide a comparison between a number of test structures formed simultaneously at each of a number of chip sites 14 on a wafer 10 and used to discriminate, e.g., tool fabrication errors from tool location errors. According to the invention of the present continuation-in-part application, the test structures of the general type shown in FIGS. 5 and 6 are employed to calibrate an imaging instrument, and may be disposed at numerous locations across a substrate in order to differentiate various sorts of errors.

Figure 2A:
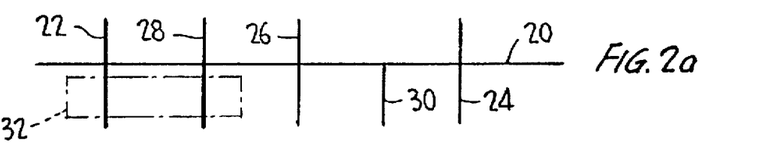
FIGS. 2(a)–(c) illustrate test structures which depict the manner in which differing types of error may occur.
Figure 2B:
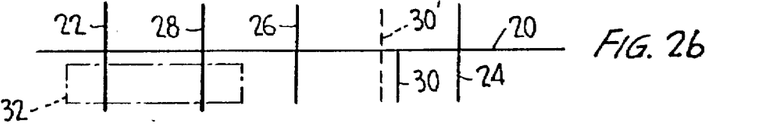
Figure 2C:
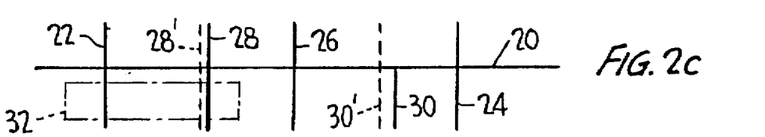

FIGS. 2(a)–(c) show, respectively, schematic views of an exemplary test structure as designed, an erroneous test structure as might result from a mask-pattern generation or "local" error, and a further erroneous test structure as might result from a mask-misalignment or "tool-wide" error between first and second patterning operations.

More specifically, FIG. 2(a) shows an exemplary desired test structure manufactured correctly, that is, according to its design, without "local" pattern generation errors or "tool-wide" mask misalignment errors. The test structure comprises an electrically-conducting bridge conductor 20 formed together with taps 22, 24, and 26 in a single patterning operation, such that under normal circumstances the taps are very precisely located with respect to one another. In a subsequent patterning operation, a further crossing tap 28 and a tap 30 are added, such that FIG. 2(a) shows the taps 28 and 30 in their intended positions. Preferably such a test structure will be formed incorporating certain improvements discussed in detail in parent application Ser. No. 08/236,202, in particular the employment of "dummy taps" (not shown) to correct for the effect of the presence of voltage-measuring taps on the measured lengths of conductive segments thereof.

If it is assumed that the portion of the mask (or other tool) used for the second patterning operation exhibits a local error, such that the mask section employed to form tap 30 is displaced, the test structure shown in FIG. 2(b) might result, i.e., wherein the tap 30 is displaced from its intended position indicated by dashed line 30'. This error will be detected by observation of the "offset" of tap 30; comparison of voltage drops between, for example, pairs of taps 26 and 30, and 24 and 30, will exhibit the displacement of tap 30 from its desired position 30'.

By comparison, if the entire mask used in the second patterning operation to form taps 28 and 30 is misaligned with respect to the previously formed portion of the test structure comprising bridge conductor 20 and taps 22, 24 and 26, the erroneous test structure shown in FIG. 2(c) might result, i.e., wherein tap 28 is displaced from its design position 28' and tap 30 is also displaced from its design position 30'. If the mask is used in a single step to form structures over the entire exposure site 14, as is usual, the misalignment error will occur over the entire exposure site, i.e., a common "tool-wide" error will appear in all features formed at a particular exposure site 14 in a given exposure using the misaligned tool. Conversely, local errors as might result from errors in the mask pattern will generally occur to the same extent at corresponding locations at all exposure sites.

According to one aspect of the invention disclosed in parent application Ser. No. 08/236,202, such tool-wise and local errors can be distinguished by proper analysis of overlay measurement. The offsets exhibits by the test structure exhibiting local errors as exemplified by the pattern of FIG. 2(b) and the test structure exhibiting tool-wide errors with FIG. 2(c) are distinguishable from one another corresponding faults in the manufacturing process can be identified and addressed.

According to another important aspect of the invention disclosed in the parent application, the test structures of FIGS. 2(a)–(c) can also be inspected by imaging instruments, by providing portions of the structure which can be measured by imaging instruments in known physical relation to portions of the structure that can be tested by electrical measurement. For example, parallel portions of taps 22 and 28 comprise a portion of a conventional "bars-in-bars" overlay test pattern, as indicated at 32. A measurement of the spacing of taps 22 and 28 can be made using an imaging instrument; according to the invention, this measurement, which will be susceptible to TIS and WIS, in addition to tool-wide errors and local errors, as discussed above, can then be calibrated with reference to an electrical measurement of the spacing of the taps 22 and 28.

As shown in FIG. 1, according to this aspect of the invention, a number of substantially identical test structures indicated generally at 12 may be formed at each of a number of exposure sites 14 on an integrated circuit wafer 10, i.e., as part of a full-scale manufacturing process, or as part of a prototype process or the like. It will be appreciated by those of skill in the art that normally the area of the wafer 10 occupied by the test structures 12 will be much smaller; the test structures are shown at large scale in FIG. 1 to enable their illustration.

In the example of FIG. 1, twenty-five groups of three nominally identical test structures 12 are provided, one group at each exposure site 14. The test structures 12 may be as discussed above, e.g., in connection with FIGS. 2(a)–(c), or may be as discussed below in connection with the composite structures of FIGS. 5 and 6, or otherwise. According to this aspect of the invention, however, the estimated overlay $O'_{ij}$ of a particular test structure j at exposure site i formed in differing manufacturing operations is measured with respect to each of the test structures 12, and is used as the input to a process whereby the least-squares sum S of the measured overlays $O'_{ij}$ is calculated to determine values for tool-wide mask alignment errors $M_i$ and local pattern errors $P_j$ at each location.

More specifically, for a substrate having $N_s$ total sites, each having $N_p$ test structures (e.g., where three test structures are formed at each of 25 locations, $N_s=25$ and $N_p=3$, such that 75 total structures are formed) the contributions of "tool-wide" misalignment $M_i$ and of "local" tool fabrication errors $P_j$ are defined to be those which minimize the quantity S, as follows:

$$S = \sum_{i=1}^{N_s} \sum_{j=1}^{N_p} (O'_{ij} - M_i - P_j)^2$$

where $O'_{ij}$ is the overlay measured with respect to the structure identified by i and j, i.e., the j-th structure at the i-th exposure site.

If the sum S of the squares of the errors according to this equation is minimized by selecting appropriate values for the actual tool-wide misalignment contributions $M_i$ and local errors $P_j$, the tool-wide misalignment contributions $M_i$ and local pattern error contributions $P_j$ to the $O'_{ij}$ measured with respect to any particular test structure 12 is the sum of the contribution $M_i$ due to misalignment of a tool used in a subsequent patterning operation with respect to a structure formed in a prior patterning operation, and the contribution $P_j$ of errors in the individual tool with respect to other portions of the individual tool plus a residual error, usually random in nature.

According to an important aspect of the invention of parent application Ser. No. 08/382,973, the same tool is used to form a portion of the test structure added to previously-formed portions of test structures at each of a plurality of test structure locations, such as exposure sites 14, so that the local error $P_j$ is systematic, appearing at the same respective location in a plurality of sets of test structures. This enables the least squares analysis discussed above to separate out tool-wide errors $M_i$ from local pattern manufacturing errors $P_j$.

Stated more generally, the $M_i$ contributions to $O'_{ij}$ for all test structures formed in a single operation, i.e., at a given exposure site 14, are tool-wide: that is, the overlay $O'_{ij}$ measured with respect to each test structure completed in a particular two-step operation at a particular exposure site will exhibit the same contribution $M_i$ due to a misregistration of the tool used for the subsequent operation with respect to a structure formed in a previous operation. The $P_j$ contribution to $O'_{ij}$ is "local"; that is, if a portion of the tool is manufactured improperly, such that a particular feature is displaced with respect to the remainder of the tool used in the second operation, that error will affect the corresponding test structure at each chip site where that tool is used. Further details of this analysis are provided in parent application Ser. No. 08/236,202, incorporated herein by reference. Those of skill in the art will recognize that provisions for magnification error and relative rotation error might also be incorporated into the statistical analysis.

As mentioned previously, according to an important aspect of the invention of the parent application Ser. No. 08/382,973, imaging instruments for overlay measurement are calibrated by reference to measurements made electrically. "Imaging instruments" as used herein refers to optical microscopes, electron microscopes, or the like, which effectively measure, for example, the relative spacing between features on a structure, the width of features, or the like, by detecting reflection of radiation from, or contrasts in transmission of radiation through, the features on a test structure.

"Electrically" as used herein refers to contact measurement techniques, such as measurement of resistance responsive to a current forced through conductive structures, and also to non-contact techniques, such as electrostatic or electromagnetic techniques. As indicated above, these imaging instruments are known to be subject to systematic errors called "shift", including so-called "tool-induced shift", typically referring to misalignment of the measuring tool, and "wafer-induced shift", as may be caused by certain characteristics of the pattern under inspection. As explained previously, tool-inducing shift ("TIS") is typically estimate by repeating measurements after reorientation of the substrate being inspected, while wafer-induced shift ("WIS") is estimated as part of a calibration exercise involving patterns having known overlay.

By comparison, electrical overlay metrology as described in the parent applications, that is, using electrical measurements carried out on test structures, is fast and inexpensive and can be very effective in process evaluation, and does not suffer from any equivalent to the TIS common to imaging metrology, while the effects of an analog to WIS on electrical measurements identified in the parent application can be rendered very small. According to one aspect of the invention of parent application Ser. No. 08/382,973, the electrical analog to WIS can be eliminated entirely.

Further according to the invention of parent application Ser. No. 08/382,973, different electrical measurement techniques may be employed depending on the materials involved; for example, if the electrical test structure is formed of several electrically-conductive materials, a technique involving measurement of the resistance between adjacent members may be employed. If the structures of interest are formed of photoresist, oxide layers, and like nonconductive materials, capacitative or inductive techniques responsive to the presence of dielectric materials may be employed.

More specifically, "TIS" in many circumstances is due to misalignment of the optical axis of the imaging instrument. Consider the problem of measuring the spacing between centerlines of features on a substrate using an optical microscope whose optical axis is not aligned perpendicularly to the substrate. As the distance of the feature off-axis increases, the measurement may be subject to increasing TIS errors. While such tool-induced shifts can be average out of feature placement measurements by rotating the substrate through 180 degrees and remeasuring the same spacings, thus canceling the error, this process is cumbersome, and requires essentially duplicate effort. It would be preferable to provide a reference structure which could be used to calibrate the imaging instrument so that subsequent measurements could be corrected for such tool-induced shift.

Figure 3A:
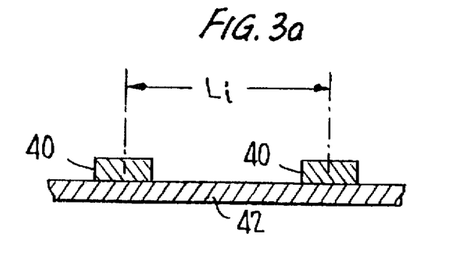
FIGS. 3(a) and (b) are cross-sectional views through conductive members on a substrate.
Figure 3B:
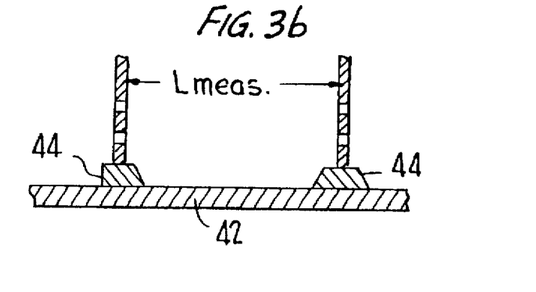

Wafer-induced shift ("WIS"), on the other hand, tends to be a function of the particular process used to form the structure. FIGS. 3(a) and (b) provide an example of one source of wafer-induced shift. In FIG. 3(a), a pair of features 40 are formed on a substrate 42. In the ideal case shown in FIG. 3(a), features 40 are perfectly rectangular in cross-section, and are spaced by distance $L_i$, usually measured center-to-center, as shown. FIG. 3(b) shows a more typical case, wherein the actual cross-sections of the features are differently asymmetrical trapezoids as shown at 44. In this case the spacing $L_{meas}$ of the features 44 is uncertain, depending on the extent to which the side walls of the features 44 contribute to the location of the apparent centerlines; this is a complex function of the illumination employed, the reflectivity of the side walls, and so on. Spacing of features as thus measured (for example) are thus uncertain to a degree referred to as wafer-induced shift ("WIS").

It would clearly be desirable to provide a certified test structure for users of imaging tools, which would provide calibration for TIS and WIS; preferably, such a tool would be fabricated using the same process techniques as that used to form the objects to be thus imaged. In one possible implementation of this aspect of the invention, a substrate having a first patterned layer formed thereon would be supplied together with a design for a second patterned layer to the semiconductor manufacturer, who would then apply the second layer, e.g., features 44 in FIG. 3(b), at the same time as the devices to be thus imaged were being manufactured. This would ensure that the features on the reference tool displaced the same asymmetries and the like, i.e., the same WIS, as the structures of direct interest, i.e., the devices being manufactured. The actual location of the features would then be measured electrically, in a process not subject to TIS.

Comparison of the electric and imaging instrument measurements allows the total shift, i.e., the sum of TIS and WIS, as measured by imaging instruments, to be accurately evaluated. According to the present invention, the electrical measurement can also be performed in a manner eliminating the electrical analog to WIS discussed in the predecessor applications. In any event, WIS is normally small in electrical measurements as compared to optical measurements, such that WIS is essentially eliminated from the latter by calibration using electrical techniques as described herein. Measurements made using the imaging instrument can then be calibrated accordingly and used subsequently to inspect accurately products being manufactured.

FIGS. 4(a)–(e) provide an example of multiple-layer structures exhibiting differing degrees of overlay, which are difficult to evaluate using imaging tools as presently available. More specifically, FIGS. 4(a)–(e) each show cross-sectional views of a multiple-layer structure formed on an insulating film 50 on a substrate, such as a silicon wafer or the like, as conventionally employed. FIGS. 4(a)–(e) show the structure formed with increasing rightward overlay of features patterned in an overlying insulative layer 54 relative to underlying features 52, 52', 52". A series of patterned conductive elements indicated at 52, 52', 52", 52'"are provided in a first operation; these each appear at the same respective position in each of FIGS. 4(a)–(e), inasmuch as they are formed using a single photolithographic mask or other unitary tooling, such that their respective positions are fixed. In a subsequent operation, an overlying insulative layer 54 is formed and is then patterned as indicated at 56, 58 and 60 to define vias extending down either to the substrate 50 or to expose the conductive members 52, 52', 52", 52'", depending on the location of the vias thus formed.

As can be appreciated by inspection of FIGS. 4(a)–(e), the relationship of vias 56, 58 and 60 is fixed, as these are also formed using a single photolithographic mask or the equivalent. However, the relation of vias 56, 58 and 60 to conductors 52, 52', 52", 52'" varies depending on the degree of accuracy of registration of the mask used to form vias 56, 58 and 60 with respect to the underlying conductors, that is, depending on the overlay. If a conductive member 62 is subsequently formed in via 60, the quality of alignment of via 60 with respect to conductor 52" can be monitored electrically. For example, if a current is forced between the conductive member 62 and the underlying member 52", as indicated schematically at 63, the resistance measured therebetween corresponds directly to the quality of alignment thereof. Thus the FIG. 4(b) structure, being better aligned, will generally exhibit less resistance between conductors 62 and 52" than, for example, the FIG. 4(e) structure. The quality of the overlay of each pattern can thus be monitored electrically, and a zero- or minimal-overlay feature (such as in FIG. 4(c)) identified.

Tools for making a comparable optical measurement of the overlay—that is, detecting the precise location of via 60 with respect to the underlying conductor 52"—are not now available. Typically, optical tools are used to estimate overlay of a pair of members formed in the same step as vias 56 and 58 relative to a pair of members formed in the same step as conductive features 52 and 52'", such that these pairs of members jointly constitute a standard frame-in-frame target. Such overlay estimates are subject to TIS and WIS errors. It is a general object of the invention, as mentioned above, to provide test structures allowing direct comparison of imaging-instrument and electrical evaluations of the overlay of a given structure, so that the imaging instrument can be calibrated.

In one embodiment of test structures implementing this aspect of the invention, a first set of plural "reference marks" which can be detected by an imaging instrument are provided in fixed spatial relationship to the vias used to form conductive structures in a number of test structure elements, and a second set of "reference members" also detectable by the imaging instrument are provided in fixed relation to underlying conductors. Imaging-instrument measurements of the relative positions of the reference marks and reference members are calibrated by comparison to corresponding electrical measurements identifying a zero-overlay test structure element. The calibrated imaging-instrument measurements are used thereafter for monitoring the accuracy of structures formed in comparable processes.

FIGS. 5 and 6 show examples of composite test structures 68, each including a number of test structure elements 69 organized as columnar test structures 81, in this case paired. The series of test structure elements 69 of each test structure 81 exhibit linearly-varying designed-in overlay. By identifying the test structure element 69 exhibiting minimal overlay, ideally null or zero overlay, objective information concerning the physical relationship of the components of the structure may be provided; this information in turn allows calibration of imaging instruments using electrical techniques as discussed above. The composite structures 68 of FIGS. 5 and 6 are nominally identical, except that the composite structure of FIG. 5 exhibits zero overlay, while that of FIG. 6 exhibits overall (i.e., rightward) positive overlay, as might occur due to manufacturing variation resulting from a tool-wide error. A comparable structure could also be shown exhibiting negative overlay.

The composite test structures 68 in FIGS. 5 and 6 both include six essentially similar but not identical columnar test structures 81, organized as pairs, each in turn comprising nine test structure elements 69. Such composite structures 68 may be disposed at spaced locations, e.g., at twenty-five exposure sites 14 across a semiconductor substrate 10 as shown in FIG. 1.

Each of the test structures 81 shown in FIGS. 5 and 6 is formed in at least two operations. Normally, a later-formed component is disposed over an earlier-formed component may also be modified in a later operation. In either case, by measuring the relative location of the components formed in the several operations, an indication of the overlay thereof can be derived. The overlay is of direct interest to the manufacturer of semiconductor products, because the overlay describes the accuracy of registration of features formed in various successive processing steps. A test structure qualified using electrical techniques to characterize the overlay can be used to calibrate an imaging instrument;

overlays subsequently measured thereby can be correlated to the actual overlay exhibited on the substrate being inspected.

Each of the structures 81 in this embodiment comprises an elongated conductor 70 including reference member 72 which is capable of detection by an imaging instrument, e.g., either an optical or electron microscope. Each test structure 81 also includes a number of individual test structure elements 69 formed in successive steps. Specific structures that may be employed for each test structure element 69 are discussed below in connection with FIGS. 11–14. Test structure elements 69 are disposed in numbered rows, one at each of a series of "test points" 74 spaced along the conductors 70. Depending on the specific design selected for the test structure elements 69, test points 74 may simply be arbitrary locations along elongated conductor 70, or may be transverse members, as illustrated. Because the conductor 70 is formed integrally in a single operation with the reference member 72, conductor 70 and the test points 74 therealong are in fixed spatial relation to the reference member 72.

A second portion of each test structure element 69, indicated by crosshatched features 78 shown in FIGS. 5 and 6, is then formed in a second operation. A feature 78 is formed in the vicinity of each test point 74 along the conductor 70; in the same step, a reference mark 76 is formed in the vicinity of the reference members 72. For example, features 78 may correspond to the conductive members 62 of FIGS. 4(a)–(e), that is, features 78 may be connecting members formed in vias in insulative layers. Features 78 are spaced successively greater distances from an arbitrary baseline 80 in fixed spatial relation to the reference marks 76. Accordingly, if an imaging-instrument measurement (providing a conventional "bars-in-bars" or "frame-in-frame" measurement) is made of the relation of the reference marks 76 with respect to the reference members 72, and this is calibrated by an electrical measurement relating the two patterned layers in a manner known to be accurate, subsequent imaging-instrument measurements can be corrected.

Figure 4A:
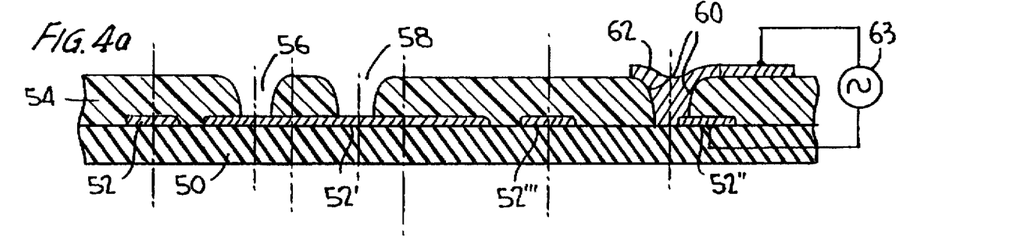
FIGS. 4(a)–(e) are cross-sectional views illustrating the effect of increasing overlay.
Figure 4B:
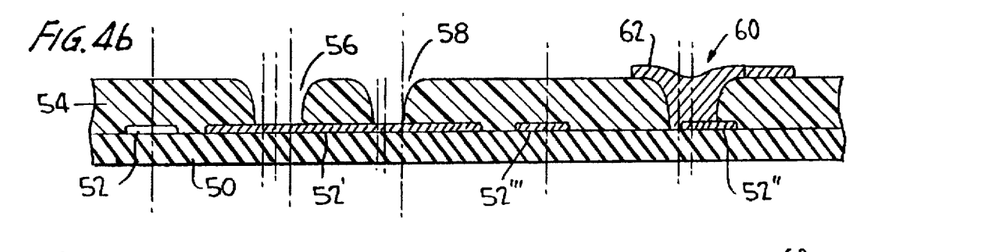
Figure 4C:
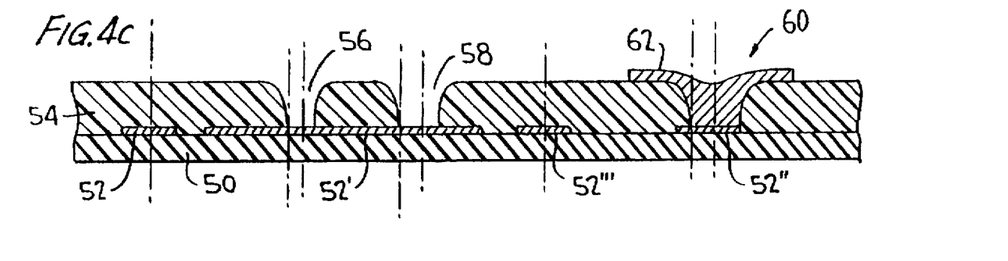
Figure 4D:
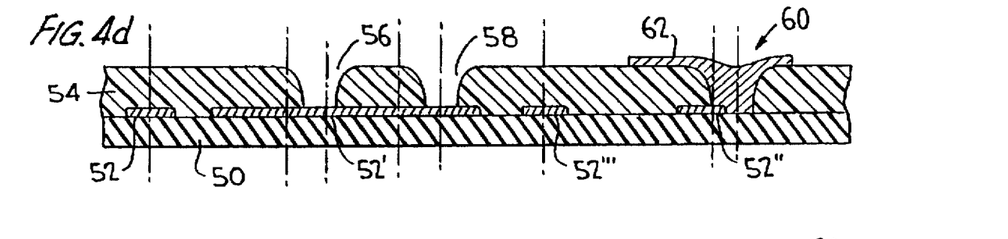
Figure 4E:
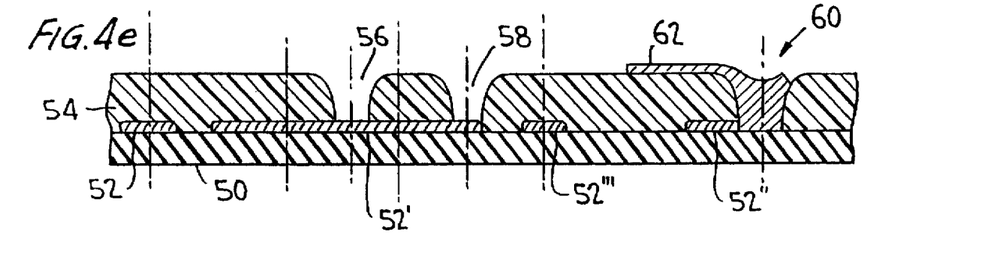

The electrical measurement necessary to this process may be accomplished by making successive electrical measurements of the position of the features 78, e.g., with respect to the center lines of respective elongated conductors 70. As indicated above in connection with FIG. 4, if the features 78 are conductive and are in physical juxtaposition with conductor 70 at the test points 74 spaced therealong, resistance measurements can be made therebetween to determine the quality of registration of each of the features 78 with respect to the underlying conductor 70. For example, in the leftmost test structure 81 in FIG. 5, feature 78 of the test structure element 69 in the seventh row of elements 69 is centered with respect to conductor 70. The test structure element 69 of row seven will therefore normally exhibit the minimum resistance, and is accordingly identified as the zero-overlay element for this particular columnar test structure 81. Correlation of this fact with the relation of reference members 72 with respect to the reference mark 76 of this particular columnar test structure 81 as measured using the imaging instrument then allows calibration of the imaging instrument.

It is thus anticipated that each of the composite test structures 68 formed at each of the exposure sites 14 (FIG. 1) will intentionally be formed to comprise left-displaced, centered, and right-displaced pairs of structures 81, as indicated by FIG. 5. The end user will be provided with an indication identifying the feature exhibiting zero overlay of each structure 81, and can use this indication, which is not susceptible to TIS or WIS, to calibrate measurements of the relation of reference indicia 72 and 76 made using his imaging instrument, and therefore subject to TIS and WIS.

It is to be expected that in actual practice all six reference marks 76 and features 78 within one composite structure will be displaced to one side or the other, as indicated in FIG. 6, wherein second-formed features are effectively misregistered to the right of these nominal positions relative to the underlying structures, that is, exhibit positive overlay. Thus providing pluralities of structures 81, and in particular where the features are nominally located successively leftwardly, centrally, and rightwardly of their respective conductors, provides redundancy and also a very clear indication of any misregistration, i.e., tool-wide error, that may be exhibited by the second-formed layer with respect to the first. Further, by providing left-going and right-going successively spaced features, any effect of tool-induced shift (manifested as a leftward or rightward bias in measurements of length, for example) is automatically compensated for in the structure itself.

For further redundancy of measurement, composite test structures exhibiting zero designed-in overlay as in FIG. 5 may be formed at each of a number of exposure sites, together with a like composite structure exhibiting positive overlay, as in FIG. 6, and a comparable composite structure (not shown) exhibiting negative designed-in overlay. By comparing the locations of each of the identified zero- or minimum-overlay features with respect to the corresponding electrical measurements, TIS and WIS can be accurately evaluated.

Summarizing, each test structure includes a first-formed patterned component defining at least one reference member and a number of test points in fixed spatial relation thereto. A subsequently-formed patterned component comprises a number of features at successively increasing distances from a baseline in fixed relation to a reference mark. The spacing of the reference members and reference marks is measured using the imaging tool, and the point at which the features of the later-formed component are best aligned with the reference member, that is, with respect to a test point fixed with respect to the reference member, is determined electrically, identifying a zero-overlay test structure element 69. As the electrical measurement does not suffer tool-induced shift or wafer-induced shift as experienced by the imaging instrument, this value can be use to calibrate the imaging instrument, eliminating both TIS and WIS.

In a typical commercial use of the invention, a test structure may be manufactured comprising a substrate and a first patterned layer; a second patterned layer including the features and reference marks is then fabricated using the same process used to form a semiconductor device of interest, that is, using a particular sequence of process steps. The test structure is then characterized electrically, in order to identify the test structure element having zero overlay; this information is then used for calibration of the imaging instruments.

In the following discussion, extensive reference has been made to making electrical measurements in a manner which allows the overlay between two patterned layers of a structure formed in a series of operations to be evaluated. As indicated generally above, e.g., in connection with FIG. 4, one way to do this is simply to form a contact element extending through a via in an insulative layer disposed between an upper patterned conductive layer and an underlying patterned conductive lower layer, and measure resistance therebetween. FIGS. 5 and 6 show one embodiment of composite test structures for "null overlay" evaluation, in which one component of each of a number of such "test structure elements" 69 is spaced progressively greater distances from a baseline, fixed with respect to a further component of each element, providing varying "designed-in" overlays. The element exhibiting the minimum resistance is the "null overlay" element. In the embodiments being discussed here, such elements take the forms illustrated in FIGS. 7 and 8.

Figure 7:
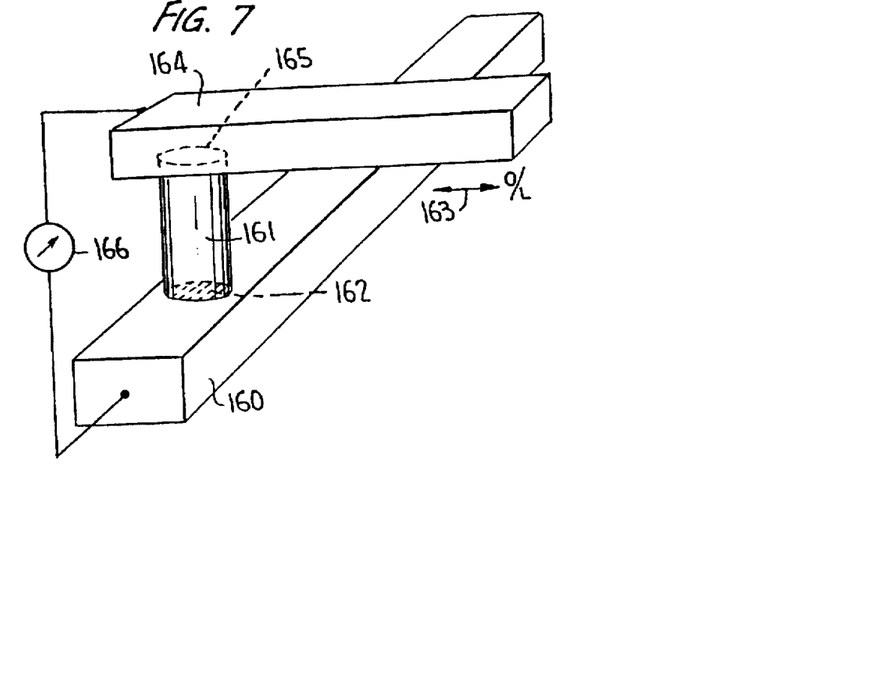
FIGS. 7 and 8 show two different types of test structure elements which may be employed for null overlay measurements, for example, as part of the overall structure shown by FIGS. 5 and 6.

FIG. 7 shows a simple test structure element, comprising a first conductor 160 which may correspond, for example, to a portion of the underlying conductors 70 of FIGS. 5 and 6, or to conductors 52" of FIGS. 4(a)–(e), formed in a patterned lower conductive layer. An intervening insulating layer (not shown) is then formed to define a via extending therethrough; in a subsequent deposition step, a columnar connection post 161 (shown as an idealized cylindrical member) is formed extending through the via. Post 161 provides electrical connection between conductor 160 and an overlying conductor 164, which may be provided in a separate subsequent deposition step, or may be formed integrally with post 161. If a resistance meter 166 is connected between conductors 164 and 160, the resistance measured is indicative of the alignment of the post 161 with respect to the underlying conductor 160, and hence of the overlay; that is, the overlay, as shown by arrow 163, is zero when the "contact patch" 162, corresponding to feature 78 in FIGS. 5 and 6, whereby current flows between post 161 and conductor 160, is centered with respect to the underlying conductor 160 in the direction 163 with respect to which the overlay is being evaluated. As noted, a number of test structure elements as in FIG. 7 may be provided with varying designed-in overlays, that is, wherein the position of their contact patches 162 varies progressively with respect to the corresponding conductor 160. Comparison of the resistances measured with respect to each identifies the "null overlay" test structure element, having its contact patch 162 essentially centered on conductor 160.

Figure 8:
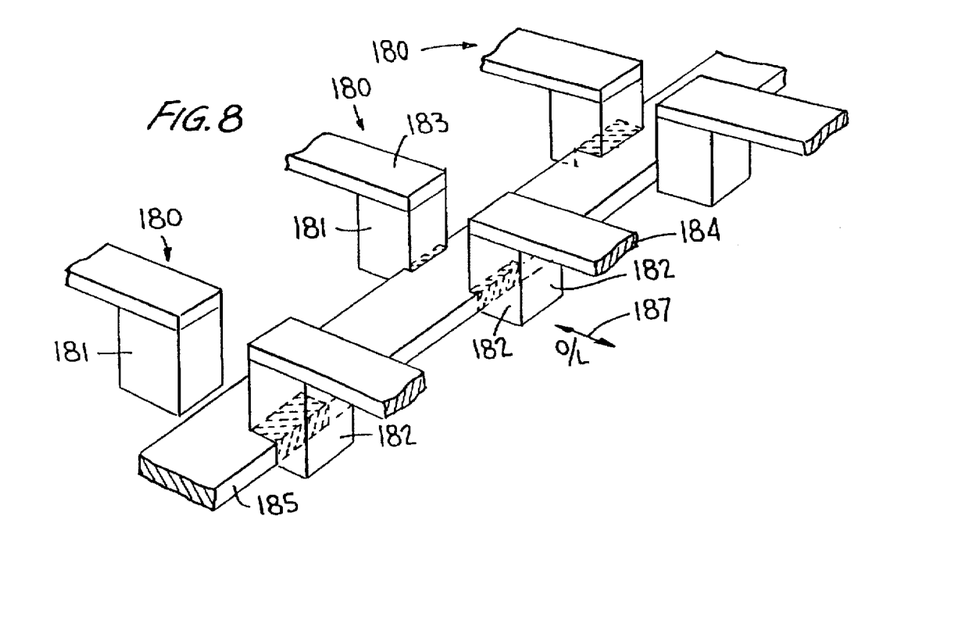

FIG. 8 is a perspective view showing three test structure elements 180 in a further embodiment of test structure elements for null-overlay detection. The elements of FIG. 8 exhibit increased rightward overlay in the dimension indicated by arrow 187 towards the upper portion of the drawing. In this case, each test structure element 180 comprises left and right conductive posts 181, 182, respectively, connected to conductors 183, 184 for external connection. As shown by FIG. 8, the conductive posts 181, 182 are spaced slightly closer than the width of an underlying conductor 185, such that the null test structure element is that in which conductors 181 and 182 both contact the underlying conductor 185. In the example of FIG. 8, the central of the three test structure elements 180 is shown with both conductive posts 181, 182 in contact with the conductor 185, such that the central test structure element would be the null overlay element. Identification of the null overlay element in this embodiment would simply involve applying a voltage successively across the paired conductors 183 and 184, and determining when current flows, to identify the test structure element having continuity.

In the test structure elements of FIGS. 7 and 8, the alignment of posts formed in vias with respect to the corresponding lower conductors determines the overlay, and hence the alignment of the vias in the insulative layer whereby the posts are formed controls the overlay. As measurement of overlay according to the invention thus evaluates the integrity of connections between spaced conductive layers, the test structure elements shown in FIGS. 7 and 8 provide measurements of overlay directly responsive to the needs of the industry.

The location of the via in the dielectric layer relative to the first layer is the structural element of direct interest. For this reason, one pair of the bars of a bars-in-bars or frame-in-frame structure discussed above and employed to calibrate an imaging instrument are usually formed in the lower conductor, corresponding to conductor 160 in FIG. 7, while the other pair of bars simply consists of channels, that is, essentially elongated vias, in the insulative layer used to form the posts 161 (FIG. 11) interconnecting the various conductive layers. Accordingly, where reference is made herein to comparison of upper and lower conductive layers using these techniques, it should be understood that normally the comparison is of the alignment of the structure connecting the two, as this is of direct interest to the IC manufacturer. For example, if the elements exhibiting progressively greater overlay in FIGS. 5 and 6 are fabricated to comprise connecting posts or connectors formed in vias, the overlay is responsive to the accuracy of alignment of the vias in the insulating layer with respect to the lower layer.

More specifically, it will be appreciated that the overlay amounts to the net misregistration of a tool used to form a later-formed component of a structure with respect to an earlier-formed component. For example, in the structure of FIG. 7, location of the via used to form post 161 determines the overlay with respect to the dimension along which arrow 163 extends. The bars-in-bars structure 72, 76 (FIG. 5) provides a corresponding optical measurement of overlay in that dimension. Of course, a similar measurement could be made with respect to the alignment of the vias with respect to the upper conductor, and this would be of generally similar significance. Such a similar measure of overlay in the orthogonal dimension, e.g., responsive to the location of an upper contact path 165 with respect to the orthogonally-extending conductor 164, would involve a second set of test structure elements extending perpendicularly to those of FIGS. 5 and 6. To calibrate an optical instrument in the direction orthogonal to arrow 163 would likewise require a second bars-in-bars structure responsive to the respective location of the upper conductive structure 164 with respect to the vias in the insulative material used to form post 161.

Thus, it will be appreciated that reference herein to measurement of the relation between upper and lower structure should be understood to include evaluation of the location of vias separately with respect to conductors extending in orthogonal directions, and that overlay properly characterized involves measurements in such orthogonal dimensions.

As discussed above, although the approach illustrated in FIGS. 5 and 6 and corresponding to that disclosed in Ser. No. 08/382,973, is a satisfactory method of implementing null detection for via-to-conductor overlay based on via-hole contact continuity, in order to provide a comfortable overlay-sensitive margin, the associated pad count, and thus the space requirements, could become quite large. This could be unacceptable in some applications, given the general desirability of overall test systems that take up as little area on the chip as possible. The present invention uses an improved edge detector approach to help eliminate or combat the problem by enabling significantly more information to be obtained from a slightly modified test structure.

Figure 9:
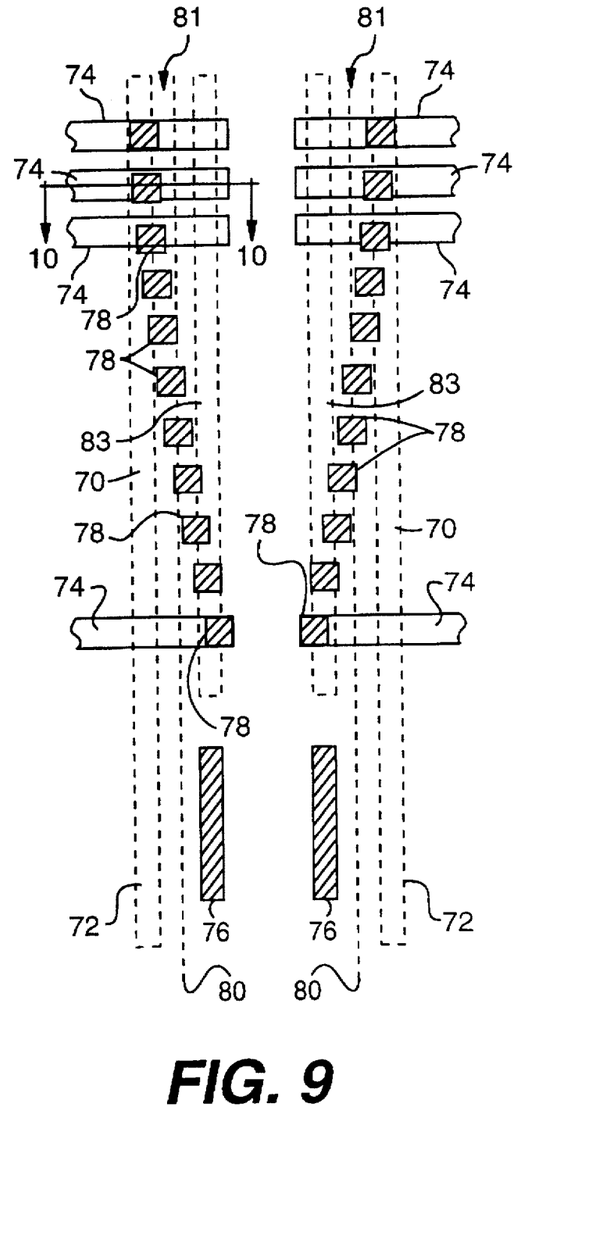
FIG. 9 is a schematic top plan view of a preferred embodiment of a portion of a test structure constructed in accordance with the present invention.

Referring to FIG. 9, a preferred embodiment of the invention is shown. The edge detector architecture shown in FIG. 9 would replace the central one-third of FIGS. 5 and 6 and common features or elements have been given the same reference numerals and corresponding architecture would replace the other features. Thus, as illustrated, a pair of columnar test structures, generally denoted 81, are arranged or organized as a pair. In this implementation, the test structures 81 each include a first elongate conductor 70, which is advantageously formed as line of polysilicon, including a reference portion 72. As is shown schematically in FIG. 10, conductor 70 is preferably formed on a film or insulating layer 85 on a chip C. A plurality of overlying conductive elements or bars 74 are arranged in longitudinally spaced relation, generally transverse or orthogonal to conductor 70 so as to overlie conductor 70 along the length thereof. As shown schematically in FIG. 10, in this embodiment, conductive elements 74 are formed on a dielectric interlayer 79 which separates conductive elements 74 from elongate conductors 70. These conductive elements 74 may simply be wire connectors and as described above in connection with FIGS. 5 and 6 and act as "test points" spaced along conductor 70.

A plurality of "test features" or conductive connectors 78 are formed in the vicinity of each transverse conductive element (test point) 74. In this embodiment, connectors 78 are formed in vias in the insulative layer 79 and may, for example, be formed from portions of conductive elements 74 that are permitted to fill the vias or through-holes, or these vias may be filled with a conductive plug or post and conductive elements 74 then formed on top thereof. As in FIGS. 5 and 6, conductive connectors 78 are spaced successively greater distances from a baseline described below, in fixed spaced relation to reference marks 76.

Figure 10:
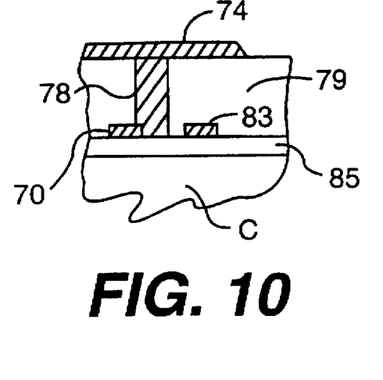
FIG. 10 is a schematic cross sectional view taken generally along lines 10—10 of FIG. 9.

The embodiment of FIGS. 9 and 10 differs from that of FIGS. 5 and 6 in the addition of further elongate conductor 83. Conductor 83 is disposed, in this embodiment, parallel to elongate conductor 70 and is formed on insulating film or layer 85. In contrast to the embodiment of FIGS. 5 and 6, the "baseline" is the centerline 80 between the conductors 70 and 83.

In general, as discussed above, the addition of conductor 83 enables the measurement operation to be refined by providing more information as to the location of test features (connectors) 78. To explain, in the embodiments of FIGS. 5 and 6 described above, wherein a measurement is made of the contact between conductor 70 and each of the conductive elements 74 to determine the location of coincidental edges, if the connector 78 does not contact both conductor 70 and a conductive element 74, there is no conduction. Thus, referring to FIG. 9, assuming that the third connector 78 from the top is not in contact with elongate conductor 70, i.e., that only the top two connectors make contact with conductor 70, all of the connectors 78 from third connector down provide no information. Because, with this measurement technique, one is essentially looking for the transition between measurements indicating contact and those indicating no contact, substantially more information is provided by the addition of conductor 83.

Considering the latter point in more detail, as is evident from FIG. 9, the additional conductor 83 provides a further non-contact to contact transition and thus will enable a determination to be made of the center between a contact, non-contact, contact sequence. More specifically, the test structure shown in FIG. 9 will permit electrical determination, by contact/non-contact testing, of which of the staggered vias (i.e., the corresponding connectors 78) most closely have zero overlay relative to the centerline 80 of the space between the parallel conductors, i.e., of the zero overlay index. If the size, i.e., width, of connectors 78 is less than the separation of lines (conductors) 70 and 83, as illustrated, the overlaying conductive elements or bars 74 corresponding to those conductors (vias) 78 most closely having zero overlay will have no electrical contact to either line (conductor) 70 and 83. Thus, in FIG. 9, the sixth connector 78 from the top is most central and the test structure thus has been fabricated to have a zero-overlay index of zero. It will be appreciated that if, for example, the fourth connector 78 was most central, the zero-overlay index would be +2, while if, for example, the ninth connector 78 was most central, the zero-overlay index would be −3. The technique used to determine the conductors most closely having zero overlay is basically that described in the parent application but using two "edge lines" and with the centerline 80 serving as the "baseline" as mentioned above.

It is not necessary that the via size be less than the separation between the lines or conductors 70 and 83, and that where the via size, and thus the width of connectors 78, is greater than this separation, the vias most clearly having zero overlay will exhibit contact with both lines 70 and 83.

Considering the method of fabricating the test structure of FIGS. 9 and 10 in more detail, the first layer of conducting material, i.e., that which forms conductors 70 and 83, and which may, for example, comprise polysilicon, is patterned on the underlying insulator film 85 and covered by the interlayer insulating (dielectric) film 79. Film 79 is then covered by photoresist and patterned for cutting the vias in which connectors 78 are formed. These steps are steps that are normally followed in wafer fabrication. The "overlay" of interest is that of the patterning of the interlayer dielectric resist relative to the patterning of the overlying elongate (polysilicon) conductors 70 and 83. Accordingly, optical overlay measurements are made on the "bars-in-bars" target components, viz, reference portion 72 of conductor 70 and reference marks 76. After the vias are cut and filled with conductive connector material forming connectors 78, the overlaying metal comprising conductive element 74 is patterned in rows as illustrated in FIG. 9. Electrical connections to electrical test prober pads would be made, referring to FIG. 9, to the upper ends of conductors 70 and 83 and to the inboard opposing ends of conductive elements 74.

It is noted that even further improved resolution can be provided, i.e., in addition to the open/short (non-contact/contact) information discussed above, by testing for or observing the existence of a third, high resistance state, such a state occurs where there is a small, but non-zero contact between the first layer (conductor 70 and/or conductor 83) and the second layer (a conductive element 74). For example, referring to FIG. 9, viewed from the top of the figure, the third and fourth connectors 78 might provide this kind or amount of contact with conductor 70 while the seventh and eighth connectors 78 might provide this kind or amount of contact with conductor 83. Because, as explained above, the data being sought are the relative locations of the two "edge lines" the additional third state may provide improved spacial resolution for the overlay.

Figure 11:
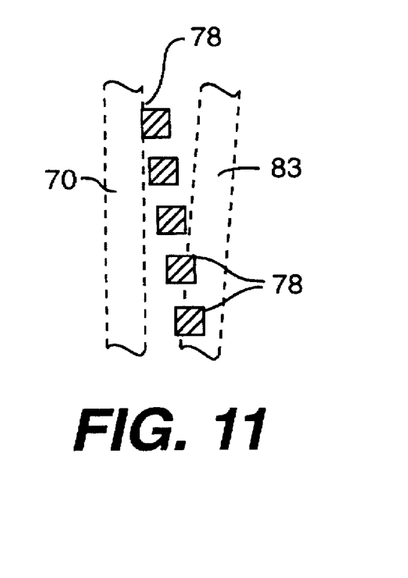
FIG. 11 is a detail of a test structure constructed in accordance with a further embodiment of the invention.

Referring to FIG. 11, it is noted that in applications where the primary pattern generator is vector scan election beam, rather than the raster scan more commonly used, the illustrated embodiment could be useful. In FIG. 11, instead of writing both lines (conductors) 70 and 83 in parallel to the left and right edges of the contacts or conductive elements 74, one of the lines 83 is written at an angle other than parallel to the edges of the second layer features 74. Alternatively, both lines could be written so as to be non-parallel to these edges. In another, related embodiment, the second layer features 74 are placed in a non-uniform manner in x and/or y directions. These embodiments could provide increased edge detection resolution because placing all features on a conventional Manhattan grid, i.e., a grid where all angles between features are either 0°, 90°, 180° or 270°, wherein the current state of the art minimum grid step is 10 nm, may limit the null detection capabilities of the structures of FIGS. 9 and 10.

While the invention has been described with a certain degree of particularity and with respect to certain preferred embodiments thereof, it is manifest that many changes may be made in the details of construction and the arrangement of components without departing from the spirit and scope of the disclosure. It is understood that the invention is not limited to the embodiments set forth herein, but is to be limited only by the scope of the appended claims including the full range of equivalency to which each element thereof is entitled.

What is claimed is:

1. A method for calibrating an imaging instrument relative to distance measurements between features of a test structure formed on a substrate, said method comprising the steps of:

forming a first conductive pattern overlying said substrate and comprising first and second spaced elongate conductors;

forming a second conductive pattern on a surface of an insulating layer overlying said first conductive pattern, said second conductive pattern comprising a plurality of longitudinally spaced conductive elements overlying said elongate conductors;

forming a like plurality of conductive connectors in vias extending through said insulating layer, said connectors each being connected to a respective conductive element being disposed at successively varying distances relative to said elongate conductors, at least a first one of said connectors interconnecting said first elongate conductor and one of said conductive elements, and at least a further one of said connectors interconnecting said second elongate conductor and a further conductive element;

performing a series of electrical measurements between said conductive elements and said first and second elongate conductors so as to provide measured values corresponding to the degree of conduction provided by said connectors between each of the conductive elements and said first conductor and between each of said conductive elements and said second conductor; and calibrating said imaging instrument using said measured values.

2. A method as claimed in claim 1, wherein said second elongate conductor is formed in parallel with said first elongate conductor.

3. A method as claimed in claim 2, wherein said conductive elements are formed in spaced, parallel relation and extend substantially orthogonally to said first and second conductors.

4. A method as claimed in claim 1, wherein said second elongate conductor is formed in non-parallel relation to said first elongate conductor.

5. A method as claimed in claim 1, further comprising forming a conductive member extending through a further via to said surface of said insulating layer so that one end of said further conductive member defines an elongate reference.

6. A method as claimed in claim 5, wherein said second elongate conductor and the elongate reference defined by said conductive member are disposed in axial alignment.

7. A method as claimed in claim 6, wherein said second elongate conductor and said elongate reference are disposed in parallel with said first elongate conductor.

8. A method as claimed in claim 1, wherein performing said electrical measurements includes determining whether a short circuit exists between each of said conductive elements and said conductors and whether an open circuit exists between each of said conductive elements and said conductors.

9. A method as claimed in claim 8, wherein performing said electrical measurements additionally comprises determining whether a high resistance connection exists between each of said conductive elements and said conductors.

10. A method as claimed in claim 1, wherein said imaging instrument comprises an optical microscope.

11. A method as claimed in claim 1, wherein said imaging instrument comprises an electron microscope.

12. A method as claimed in claim 1, wherein said first and second conductors are separated by a space therebetween and said electrical measurements are used to determine which of said conductive connectors most closely have zero overlay relative to the centerline of the space between said conductors.

13. A method as claimed in claim 1, wherein said connectors have a width less than that of the space between said conductors.

14. A test structure for enabling calibration of imaging instruments for measuring overlay, said test structure comprising:

a substrate;

a first conductive pattern disposed on a surface of said substrate, a second conductive pattern disposed on a surface of an insulating layer overlying said substrate, said first conductive pattern including first and second elongate conductors and said second conductive pattern comprising a plurality of longitudinally spaced conductive elements overlying said elongate conductors along the lengths thereof, a like plurality of conductive connectors each extending through a via in said insulating layer and being connected to a respective conductive element, said connectors being disposed at successively varying distances relative to said elongate conductors, at least a first one of said connectors interconnecting said first elongate conductor and one of said conductive elements, and at least a further one of said connectors, interconnecting said second conductor and a further conductive element.

15. A test structure as claimed in claim 14, wherein said second elongate conductor is disposed parallel to said first elongate conductor.

16. A test structure as claimed in claim 14, wherein said second elongate conductor is disposed in non-parallel relation to said first elongate conductor.

17. A test structure as claimed in claim 14, further comprising a conductive post extending through a further via to said surface of said insulating layer so that one end thereof defines an elongate reference.

18. A test structure as claimed in claim 17, wherein said second elongate conductor and the elongate reference defined by said conductive post are disposed in axial alignment.

19. A test structure as claimed in claim 18, wherein said second elongate conductor and said elongate reference are disposed in parallel with said first elongate conductor.

20. A test structure as claimed in claim 14, wherein said conductive elements comprise a row of spaced parallel bars extending substantially orthogonally to and overlying said first and second conductors.

* * * * *